(12) United States Patent
Tetsukawa et al.

(10) Patent No.: US 7,551,001 B2
(45) Date of Patent: Jun. 23, 2009

(54) RECONFIGURABLE SEMICONDUCTOR INTEGRATED CIRCUIT AND PROCESSING ASSIGNMENT METHOD FOR THE SAME

(75) Inventors: Tatsuya Tetsukawa, Osaka (JP); Minoru Okamoto, Osaka (JP); Shinichi Marui, Osaka (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 11/667,302

(22) PCT Filed: Oct. 2, 2006

(86) PCT No.: PCT/JP2006/019671

§ 371 (c)(1),
(2), (4) Date: May 8, 2007

(87) PCT Pub. No.: WO2007/040192

PCT Pub. Date: Apr. 12, 2007

(65) Prior Publication Data

US 2008/0061834 A1  Mar. 13, 2008

(30) Foreign Application Priority Data

Oct. 5, 2005  (JP) .............................. 2005-292659

(51) Int. Cl.
*H03K 19/173* (2006.01)
(52) U.S. Cl. .............................. 326/93; 326/38; 326/41
(58) Field of Classification Search .............. 326/38–41, 326/46, 47, 93
See application file for complete search history.

(56) References Cited

U.S. PATENT DOCUMENTS 5,475,830 A    12/1995   Chen et al.
5,649,167 A    7/1997    Chen et al.
6,326,812 B1   12/2001   Jefferson
6,703,859 B2 * 3/2004    Kumamoto .................. 326/38

(Continued)

FOREIGN PATENT DOCUMENTS

JP          6-295319        10/1994

(Continued)

OTHER PUBLICATIONS

"Dynamic Reconfigurable Device: Its Feature and Proficiency," Design Wave Magazine, Aug. 2004, pp. 19-29.

(Continued)

*Primary Examiner*—Daniel D Chang
(74) *Attorney, Agent, or Firm*—McDermott Will & Emery LLP

(57) ABSTRACT

A plurality of logic element groups LEG11 to LEG33 respectively include at least one logic element as a component of a reconfigurable semiconductor integrated circuit. Between any logic element groups engaging in data transmission/reception, e.g., LEG11 and LEG12, clock out terminal and clock in terminal are connected via a line while data out terminal and data in terminal are connected via a delay element 101. The logic element groups LEG11 to LEG33 are therefore independent of one another in terms of timing design. Thus, if redesign is necessary for a semiconductor integrated circuit completed with a plurality of logic element groups, only a new circuit may be designed and connected to an existing circuit, or an unnecessary logic element group may just be removed, to complete a new semiconductor integrated circuit.

27 Claims, 5 Drawing Sheets

U.S. PATENT DOCUMENTS

2006/0006904 A1 * 1/2006 Marui .................. 326/38

FOREIGN PATENT DOCUMENTS

JP  8-87537  4/1996

OTHER PUBLICATIONS

Akihito Azetsu, "Circuit Synchronization and Clock," Interface, vol. 22-2, Mar. 1, 1996, pp. 197-200.

W. Takahashi et al., "Clock Routing Driven Placement in Semi-Synchronous Circuits," The Institute of Electronics, Information and Communication Engineers, Technical Report of IEICE, CPSY97-69 (Oct. 1997).

* cited by examiner

RECONFIGURABLE SEMICONDUCTOR INTEGRATED CIRCUIT AND PROCESSING ASSIGNMENT METHOD FOR THE SAME

RELATED APPLICATIONS

This application is the U.S. National Phase under 35 U.S.C. § 371 of International Application No. PCT/JP2006/319671, filed on Oct. 2, 2006, which in turn claims the benefit of Japanese Application No. 2005-292659, filed on Oct. 5, 2005, the disclosures of which Applications are incorporated by reference herein.

TECHNICAL FIELD

The present invention relates to a reconfigurable semiconductor integrated circuit and a processing assignment method for the same.

BACKGROUND ART

In recent years, with improvement in the degree of semiconductor integration, a system integrated into LSI has become larger in scale and more complicated. As a result, the design time has increased, and also the incidence of unavoidable design defects in software has increased. In the market, however, demands have been made for further reduction in turnaround time (TAT) (shortening of the design time of a new product) and higher quality design.

To address the above problem, there is known a technology in which a reconfigurable semiconductor integrated circuit is used to contribute to shortening of the design time and reduction in the number of defects. A reconfigurable semiconductor integrated circuit includes programmable logic devices represented by recently available field programmable gate arrays (FPGAs). As described in Non-Patent Literature 1, for example, a programmable logic device is an integrated circuit, provided with a plurality of logic elements, which can implement any given processing function by changing the processing functions of the logic elements and the connection states between the logic elements. A plurality of such programmable logic devices are connected to each other to complete a reconfigurable semiconductor integrated circuit. Once such a reconfigurable semiconductor integrated circuit is completed as a device, how to assign processing for the device to execute the processing can be done only by software. This makes it unnecessary to design both hardware and software, and thus shortens the design time. As another advantage, since all the processing functions are implemented by software, only correction of software will suffice if a defect happens to occur.

Non-Patent Literature 1: "Douteki saikouseikanou device—sono sujou to jitsuryoku (Dynamic reconfigurable device—Its origin and capability)" edited by Design Wave Magazine, pp. 19-29, August 2004

DISCLOSURE OF THE INVENTION

Problems to be Solved by the Invention

Even in a reconfigurable semiconductor integrated circuit, there may arise a necessity to redesign the reconfigurable semiconductor integrated circuit itself in such a case that the performance thereof is insufficient or excessive for a required processing amount, for example.

In the conventional reconfigurable semiconductor integrated circuit, when it becomes necessary to newly add one or a plurality of programmable logic devices, not only design of such a new device but also redesign of an existing circuit incorporating the new device are necessary. To state more specifically, in the conventional reconfigurable semiconductor integrated circuit, a clock signal is distributed from one clock signal supply point to a plurality of programmable logic devices, and clock skew is adjusted to a minimum between the programmable logic devices so that all the programmable logic devices operate synchronously. If a new circuit is added to an existing circuit at redesign, however, the load varies in an existing programmable logic device to which the new programmable logic device is added/connected and another programmable logic device that transmits a data signal to the above device. For this reason, clock skew must be readjusted over the entire existing circuits, and this requires redesign. This drawback also applies to the case of deleting an unnecessary circuit. Conventionally, therefore, if there arises a necessity to redesign the reconfigurable semiconductor integrated circuit, it is unable to satisfy the demand for shortening the design time effectively.

In view of the above problem, an object of the present invention is providing a reconfigurable semiconductor integrated circuit in which even if there arises a necessity to redesign the reconfigurable semiconductor integrated circuit itself, only design of a new circuit and deletion of an unnecessary circuit portion will be necessary, with no change added to any existing circuit, to complete the entire redesign, and a processing assignment method for efficiently assigning processing desired to be executed for such a reconfigurable semiconductor integrated circuit.

Means for Solving the Problems

To attain the above object, according to the present invention, a plurality of programmable logic devices (logic element groups) constituting a reconfigurable semiconductor integrated circuit are made independent of each other in terms of the timing design of data transmission/reception. In other words, unlike the conventional design in which every clock skew between a plurality of programmable logic devices is designed to a minimum, clock skew is positively given between two logic element groups engaging in data transmission/reception, and data transmission/reception is performed considering this clock skew.

The reconfigurable semiconductor integrated circuit of the present invention is a reconfigurable semiconductor integrated circuit provided with a plurality of logic elements as components, including: a plurality of logic element groups each having at least one of the logic elements, wherein each of the plurality of logic element groups has at least one of each of data input, data output, clock input and clock output, supply of a clock signal to a (k+1)th (k is any given natural number) logic element group among the plurality of logic element groups is attained by connecting a clock output of a k-th logic element group to a clock input of the (k+1)th logic element group, and a delay element is inserted on a data line from the k-th logic element group to the (k+1)th logic element group so that a hold constraint of the (k+1)th logic element group is satisfied.

In the reconfigurable semiconductor integrated circuit described above, a data output of an l-th (l is a natural number satisfying l<k) logic element group may be connected to a data input of the k-th logic element group.

In the reconfigurable semiconductor integrated circuit described above, a data output of an m-th (m is a natural number satisfying m>k) logic element group may be connected to a data input of the k-th logic element group.

In the reconfigurable semiconductor integrated circuit described above, relay means for data transfer may be provided on a data line from the m-th logic element group to the k-th logic element group.

In the reconfigurable semiconductor integrated circuit described above, the delay element inserted to satisfy the hold constraint may be provided in the k-th logic element group as the data output side.

In the reconfigurable semiconductor integrated circuit described above, the delay element inserted to satisfy the hold constraint may be provided on the data line between the k-th logic element group as the data output side and the (k+1)th logic element group as the data input side.

In the reconfigurable semiconductor integrated circuit described above, the delay element inserted to satisfy the hold constraint may be provided in the (k+1)th logic element group as the data input side.

In the reconfigurable semiconductor integrated circuit described above, the delay element inserted to satisfy the hold constraint may be provided at at least one position among in the k-th logic element group as the data output side, on the data line between the k-th logic element group as the data output side and the (k+1)th logic element group as the data input side, and in the (k+1)th logic element group as the data input side.

In the reconfigurable semiconductor integrated circuit described above, a logic gate permitting selection of whether or not to supply the clock signal to the (k+1)th logic element group may be provided on a clock line between the clock output of the k-th logic element group and the clock input of the (k+1)th logic element group.

In the reconfigurable semiconductor integrated circuit described above, the plurality of logic element groups may be arranged in a two-dimensional matrix, and a plurality of logic element groups arranged in a same row in the two-dimensional matrix may be set to have an equal delay time from a clock source.

In the reconfigurable semiconductor integrated circuit described above, the plurality of logic element groups may be arranged in a two-dimensional matrix, and a plurality of logic element groups arranged in a same column in the two-dimensional matrix may be set to have an equal delay time from a clock source.

In the reconfigurable semiconductor integrated circuit described above, the number of synchronized logic element groups placed at positions large in the delay time from a clock source may be set to be larger than the number of synchronized logic element groups placed at positions small in the delay time from the clock source.

In the reconfigurable semiconductor integrated circuit described above, the plurality of logic element groups may be arranged in a two-dimensional matrix of M×N (M and N are natural numbers), and when the clock signal is inputted into a logic element group located at a position xy (x is any given natural number between 1 to M and y is any given natural number between 1 to N) in the two-dimensional matrix, a plurality of logic element groups equal in the value of $|x-a|+|y-b|$, among logical element groups located at a position ab (a is a natural number satisfying $a \neq x$ and $a \leq M$, and b is a natural number satisfying $b \neq y$ and $y < b \leq N$), may be set to have an equal clock delay.

In the reconfigurable semiconductor integrated circuit described above, the plurality of logic element groups may be arranged in a three-dimensional matrix.

In the reconfigurable semiconductor integrated circuit described above, a delay amount of data lines between the logic element groups may be determined according to a delay amount of clock lines between the logic element groups.

In the reconfigurable semiconductor integrated circuit described above, clock signals different in delay may be supplied to the logic element groups.

The processing assignment method for a reconfigurable semiconductor integrated circuit of the present invention is a method for assigning processing for a reconfigurable semiconductor integrated circuit including a plurality of logic element groups each having at least one logic element, supply of a clock signal to a (k+1)th (k is any given natural number) logic element group among the plurality of logic element groups being attained by connecting a clock output of a k-th logic element group to a clock input of the (k+1)th logic element group, and a delay element being inserted on a data line from the k-th logic element group to the (k+1)th logic element group so that a hold constraint of the (k+1)th logic element group is satisfied. The processing assignment method includes: sorting two or more tasks constituting one piece of processing in time sequence; and assigning a task earlier in the order of the tasks sorted in time sequence to a logic element group closer to a clock source.

In the processing assignment method for a reconfigurable semiconductor integrated circuit described above, whether the processing is continuously operating processing or non-continuously operating processing may be determined, the continuously operating processing may be assigned to a logic element group small in the delay time from the clock source, and the non-continuously operating processing may be assigned to a logic element group large in the delay time from the clock source.

In the processing assignment method for a reconfigurable semiconductor integrated circuit described above, in data transfer from a first logic element group large in the delay time from the clock source to a second logic element group small in the delay time from the clock source, whether or not the data transfer falls within a range in which a setup time of the second logic element group is secured may be determined, and if it falls within the range in which the setup time of the second logic element group is secured, processing may be assigned to the first and second element groups so that data is directly transferred from the first logic element group to the second logic element group.

In the processing assignment method for a reconfigurable semiconductor integrated circuit described above, in data transfer from a first logic element group large in the delay time from a clock source to a second logic element group small in the delay time from the clock source, whether or not the data transfer falls within a range in which a setup time of the second logic element group is secured may be determined, and if it does not fall within the range in which the setup time of the second logic element group is secured, processing may be assigned to the first and second element groups so that data is sequentially transferred from the first logic element group to the second logic element group via at least one logic element group for data relaying with which the setup time is secured.

In the processing assignment method for a reconfigurable semiconductor integrated circuit described above, in data transfer from a first logic element group large in the delay time from a clock source to a second logic element group small in the delay time from the clock source, whether or not the data transfer falls within a range in which a setup time of the second logic element group is secured may be determined, and if it does not fall within the range in which the setup time of the second logic element group is secured, processing may be assigned to the first and second element groups so that data is sequentially transferred from the first logic element group to the second logic element group via at least one data relay means with which the setup time is secured.

In the processing assignment method for a reconfigurable semiconductor integrated circuit described above, the at least one logic element group for data relaying may be selected so that the delay time of a data line from the first logic element group to the second logic element group is divided into equal parts.

In the processing assignment method for a reconfigurable semiconductor integrated circuit described above, the at least one data relay means may be provided so that the delay time of a data line from the first logic element group to the second logic element group is divided into equal parts.

Alternatively, the processing assignment method for a reconfigurable semiconductor integrated circuit of the present invention is a method for assigning processing for a reconfigurable semiconductor integrated circuit including a plurality of logic element groups each having at least one logic element, supply of a clock signal to a (k+1)th (k is any given natural number) logic element group among the plurality of logic element groups being attained by connecting a clock output of a k-th logic element group to a clock input of the (k+1)th logic element group, and a delay element being inserted on a data line from the k-th logic element group to the (k+1)th logic element group so that a hold constraint of the (k+1)th logic element group is satisfied. The processing assignment method includes: searching for a feedback path as a data transfer path from a logic element group large in the clock delay time from a clock source to a logic element group small in clock delay time; and assigning processing to the logic element group large in clock delay time so that the delay time of the feedback path found by the search falls within a predetermined range.

In the processing assignment method for a reconfigurable semiconductor integrated circuit described above, the predetermined range may be a delay time range satisfying a setup constraint of a logic element group that receives data.

As described above, according to the present invention, in data transfer from a logic element group that outputs a clock signal to a logic element group that operates in response to the clock signal received, the logic element group that operates in response to the clock signal received can satisfy the setup constraint because it receives the clock signal delayed by a predetermined time from the logic element group that outputs the clock signal. Also, since a delay element is provided on a data line between the two logic element groups, the hold constraint can be satisfied. Therefore, these two logic element groups are independent of each other in terms of timing design. Thus, if redesign becomes necessary for a reconfigurable semiconductor integrated circuit, an unnecessary logic element group, if any, may just be removed on the layout, or only a new circuit portion of a new logic element group, if any, may be designed and connected to an existing circuit. In this way, a new reconfigurable semiconductor integrated circuit can be completed without the necessity of clock redesign of the entire circuit.

EFFECT OF THE INVENTION

As described above, according to the present invention, even if there arises a necessity to redesign a reconfigurable semiconductor integrated circuit, no clock redesign involving existing circuits is necessary. Thus, the design time of a new reconfigurable semiconductor integrated circuit can be effectively shortened.

Figure 1:
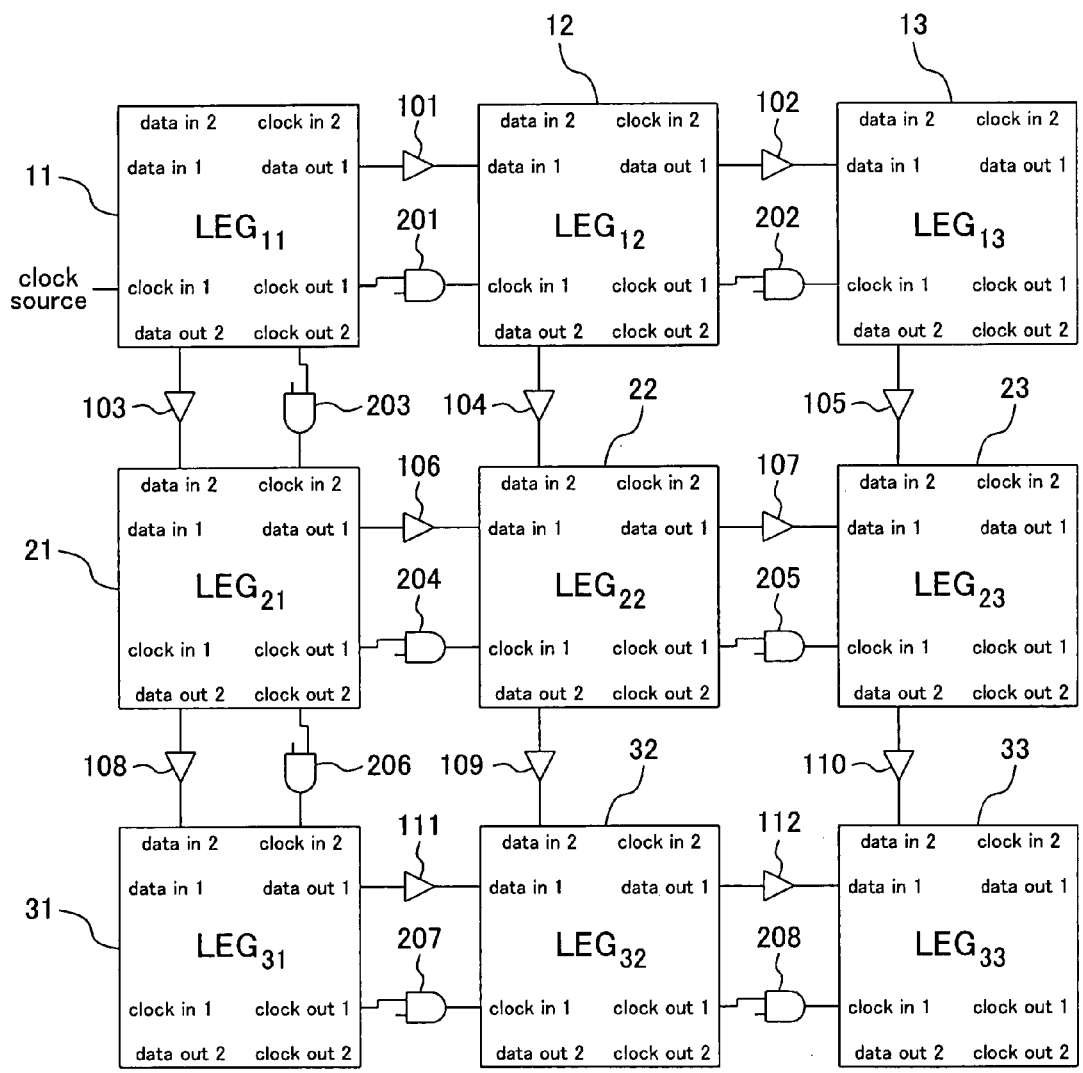
FIG. 1 is a view showing a configuration of a reconfigurable semiconductor integrated circuit of Embodiment 1 of the present invention.

DESCRIPTION OF REFERENCE NUMERALS 11 to 13, 21 to 23, 31 to 33 Logic element groups
101 to 112 Delay elements
201 to 208 AND circuits (logic gates)
301, 302, 310 to 312 Feedback paths
401 Relay circuit (relay means) (data relay means)
S501 Processing analysis step
S502 Sorting step
S503 Processing assignment step
S511 Task determination step
S512 Processing assignment step

BEST MODE FOR CARRYING OUT THE INVENTION

Hereinafter, embodiment of the present invention will be described with reference to the drawings.

Embodiment 1

FIG. 1 is a view showing a configuration of a reconfigurable semiconductor integrated circuit of Embodiment 1 of the present invention.

The reconfigurable semiconductor integrated circuit of FIG. 1 has nine logic element groups 11 to 13, 21 to 23 and 31 to 33 arranged in a two-dimensional matrix of three rows and three columns (M×N=3×3). Each of the logic element groups 11 to 33 includes at least one logic element (not shown). Each logic element is provided with a plurality of operators, a plurality of resistors, memories and the like although not shown. Each of the logic element groups 11 to 33 also includes two clock input terminals clock in 1 and clock in 2, two clock output terminals clock out 1 and clock out 2, two data input terminals data in 1 and data in 2, and two data output terminals data out 1 and data out 2. Note that at least one of each kind of these terminals may be provided.

Supply of a clock signal to the reconfigurable semiconductor integrated circuit of FIG. 1 is made via the clock input clock in 1 of the first-row, first-column logic element group 11. The clock signal is then supplied from the clock output clock out 1 of the first-row, first-column logic element group 1 to the clock input clock in 1 of the first-row, second-column logic element group 12, and also from the clock output clock out 2 of the first-row, first-column logic element group 11 to the clock input clock in 2 of the second-row, first-column logic element group 21. The clock signal supplied in the row and column directions as described above is further distributed to logic element groups in the row and column directions in a similar manner.

Input/output of data among the logic element groups 11 to 33 is made in a manner similar to the distribution of the clock signal. That is, data is transmitted from the data output terminal data out 1 of the first-row, first-column logic element group 11 to the data input terminal data in 1 of the first-row, second-column logic element group 12, and also from the data output terminal data out 2 of the first-row, first-column logic element group 11 to the data input terminal data in 2 of the second-row, first-column logic element group 21. In this manner, the data is further transmitted in the row and column directions.

In the logic element groups 11 to 33, 2-input AND circuits (logic gates) 201 to 208 are inserted on clock lines connecting the clock outputs clock out 1 with the clock inputs clock in 1, or clock lines connecting the clock outputs clock out 2 with the clock inputs clock in 2, between any two logic element groups adjacent to each other horizontally or vertically. The clock signal is inputted into one of the two inputs of each of the AND circuits 201 to 208 and an operation stop control signal is inputted into the other input thereof. When the operation stop control signal is in L level, the supply of the clock signal is stopped for the logic element group receiving the clock signal via the AND circuit in question. The logic element group therefore stops its operation. In this way, supply of the clock signal can be controlled individually for the logic element groups 11 to 33, and thus reduction in power consumption can be attained.

Also, in the logic element groups 11 to 33, each of delay elements 101 to 112 for securing a data hold time is inserted on the data line connecting the data output data out 1 with the data input data in 1, or the data line connecting the data output data out 2 with the data input data in 2, between any two logic element groups adjacent to each other horizontally or vertically. These delay elements are respectively made of a buffer in the illustrated example. These delay elements 101 to 112 are not necessarily inserted on the data lines, but may be placed inside at least one of the data-input and data-output side logic element groups.

Thus, in this embodiment, between two logic element groups (for example, 11 and 12) engaging in data transmission/reception, the second (k=2) logic element group 12 that receives data receives the clock signal via the clock line from the first (l=1) logic element group 11 that transmits the data. The reception of the clock signal is thus delayed by the time of propagation of the clock signal through the clock line. Therefore, in the logic element group 12 that receives data, a setup constraint in capture/hold of the data from the logic element group 11 that transmits the data is satisfied. Moreover, since the delay element 101 is inserted on the data line between the logic element groups 11 and 12, a hold constraint can be satisfied by setting the delay time in the delay element 101 at an appropriate time considering the delay time of propagation of the clock signal. In general semiconductor circuit design, both the setup constraint and the hold constraint must be considered in insertion of a delay element. In this embodiment, since only the hold constraint can be considered in insertion of the delay element, the timing design is easy.

Thus, the two logic element groups 11 and 12 are independent of each other in terms of the timing design. When there arises a necessity to redesign the reconfigurable semiconductor integrated circuit composed of nine logic element groups 11 to 33 shown in FIG. 1, therefore, an unnecessary logic element group (33, for example), if any, can be deleted on the layout. If a new logic element group is necessary, only the new circuit portion may be designed and simply connected to the clock output clock out 1 or clock out 2 and the data output data out 1 or data out 2 of an existing logic element group (13, 31, for example). In this way, a new reconfigurable semiconductor integrated circuit can be completed without the necessity of clock redesign of the entire circuit, and thus the design time of the new reconfigurable semiconductor integrated circuit can be shortened.

In the case that processing is completed within each logic element group and the processing result is just passed to the next logic element group, it is unnecessary to make the clock delay uniform over the logic element groups 11 to 33. By allowing clock signals different in delay to be supplied to the logic element groups 11 to 33, therefore, the timing design can be made easy.

(First Alteration)

Figure 2:
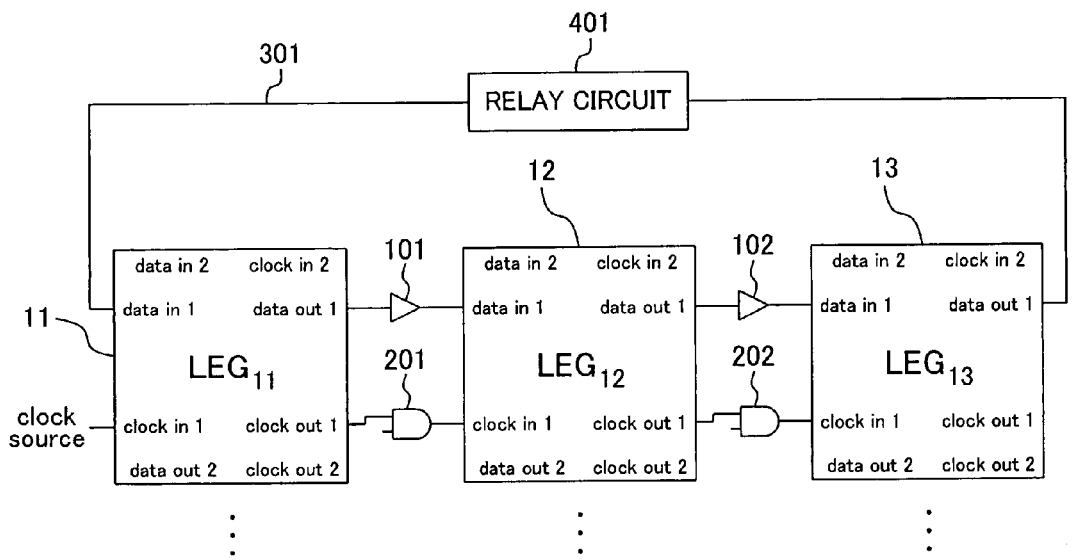
FIG. 2 is a view showing an alteration to the reconfigurable semiconductor integrated circuit of Embodiment 1.

FIG. 2 shows a semiconductor integrated circuit having an additional configuration to the reconfigurable semiconductor integrated circuit of FIG. 1.

In FIG. 2, only the first-row logic element groups 11 to 13 are shown, omitting the second-row and third-row logic element groups 21 to 33. In this alteration, in data transfer from the data output data out 1 of the third (k=3) logic element group 13 large in clock delay to the data input data in 1 of the first (m=1) logic element group 11 small in clock delay, if this data transfer is too slow to satisfy the setup constraint of data in the logic element group 11 that receives data, a relay circuit (relay means) 401 is placed on a data line 301 between the logic element groups 13 and 11. The relay circuit 401 may be made of a flipflop circuit, for example.

Thus, in this alteration, with the placement of the relay circuit 401, even in the case of data transfer from the logic element group 13 large in clock delay to the logic element group 11 small in clock delay, the setup constraint of the data line 301 can be satisfied enabling data transfer therethrough.

<Processing Assignment Method—First Example>

Next, a processing assignment method for assigning processing for the reconfigurable semiconductor integrated circuit of FIG. 1 will be described.

Figure 3:
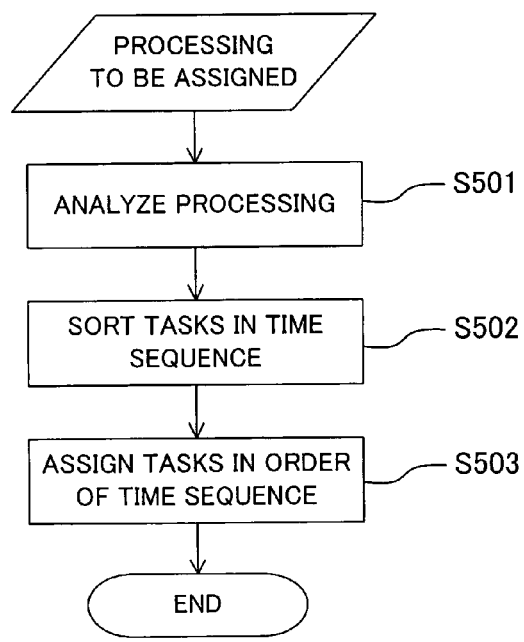
FIG. 3 is a basic flowchart adopted in assigning processing for the reconfigurable semiconductor integrated circuit of Embodiment 1.

FIG. 3 shows a procedure of the processing assignment method for the reconfigurable semiconductor integrated circuit of FIG. 1. Referring to FIG. 3, in step S501, the contents and order of a plurality of tasks constituting one piece of processing are analyzed. Thereafter, in step S502, the plurality of tasks are sorted in time sequence. Finally, in step S503, the tasks are sequentially assigned to the logic element groups in the order of the first task being assigned to the logic element group closest to the clock signal supply point (i.e., the logic element group 11) among the plurality of logic element groups 11 to 33 constituting the reconfigurable semiconductor integrated circuit of FIG. 1.

For efficient assignment of processing for the reconfigurable semiconductor integrated circuit of FIG. 1, it is desirable to assign processing so that the processing flows from small to large in the delay time from the clock supply point, that is, so that there is less data transfer from large to small in the delay time from the clock supply point on a data line. In this processing assignment method, the tasks of processing to be assigned are sorted in time sequence, and the tasks are sequentially assigned to the logic element groups in the order of the first task being assigned to the logic element group smallest in the delay from the clock supply point. The efficiency of the processing assignment is therefore improved.

<Processing Assignment Method—Second Example>

Figure 4:
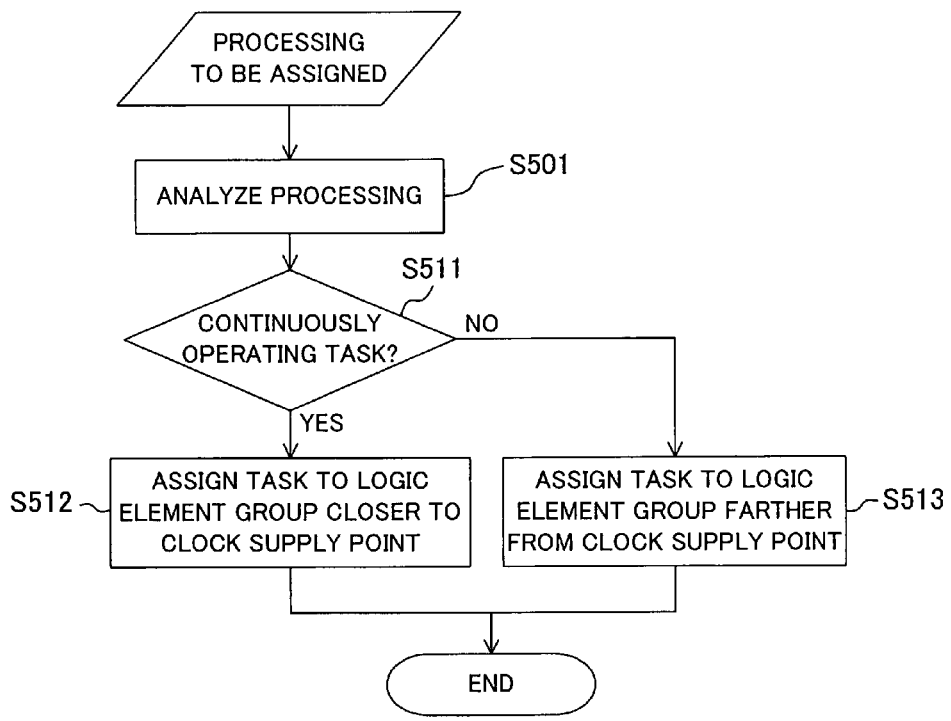
FIG. 4 is another basic flowchart adopted in assigning processing for the reconfigurable semiconductor integrated circuit of Embodiment 1.

FIG. 4 shows another example of procedure of the processing assignment method for the reconfigurable semiconductor integrated circuit of FIG. 1.

Referring to FIG. 4, in step S501, the contents and order of a plurality of tasks constituting one piece of processing are analyzed. Thereafter, in step S511, whether each of the plurality of tasks is a continuously operating task or a non-continuously operating task is determined based on the analysis result. In the case of a continuously operating task, the task is assigned to a logic element group closer to the clock supply point in step S512. In the case of a non-continuously operating task, the task is assigned to a logic element group farther from the clock supply point in step S513. In the latter case, when the logic element group farther from the clock supply point does not operate, an operation stop control signal (L level) may be supplied to the corresponding AND circuit (for example, 201 in FIG. 1) so that the supply of the clock signal to this logic element group can be stopped.

Thus, in this processing assignment method, the tasks are classified with the operation frequency: while a task high in operation frequency is assigned to a logic element group small in the delay time from the clock supply point, a task low in operation frequency is assigned to a logic element group large in the delay time from the clock supply point. For a logic element group to which a task low in operation frequency has been assigned, therefore, the clock signal is supplied only when the operation is necessary. Thus, reduction in power consumption can be attained.

<Processing Assignment Method—First Alteration>

Figure 5:
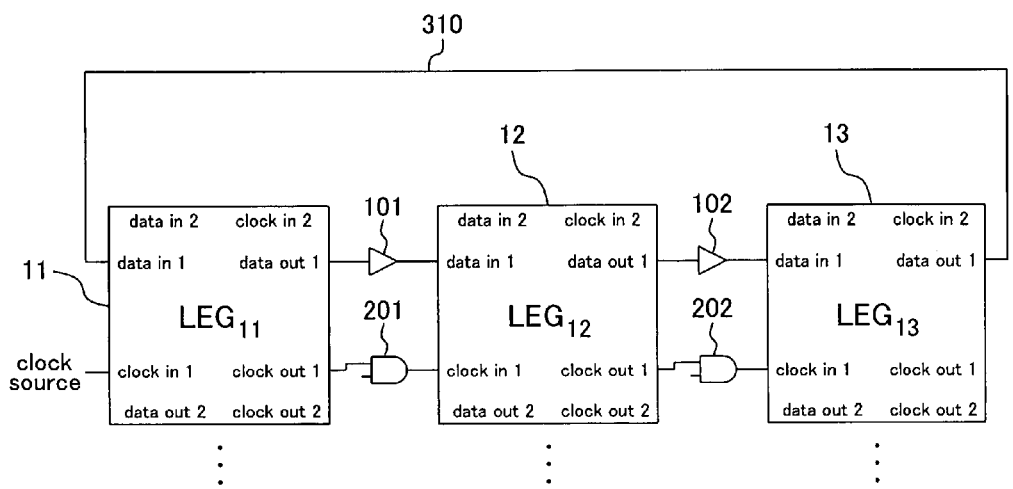
FIG. 5 is a view showing a data line feedback configuration in the case of succeeding in satisfying a setup constraint in the reconfigurable semiconductor integrated circuit of Embodiment 1.

FIG. 5 shows an alteration to the processing assignment method for the reconfigurable semiconductor integrated circuit of FIG. 1.

In this alteration, the following processing assignment is added after the execution of the processing assignment described with reference to FIG. 3 or 4. That is, in FIG. 5, when there exists data transfer from the logic element group 13 to the logic element group 11, for example, if the setup constraint is satisfied in the logic element group 11 as the receiver side of data outputted from the logic element group 13 large in the delay of the clock signal, assignment of processing and the data line 310 is made so that direct connection to the data input data in 1 of the logic element group 11 is secured to effect direct data transfer.

<Processing Assignment Method—Second Alteration>

Figure 6:
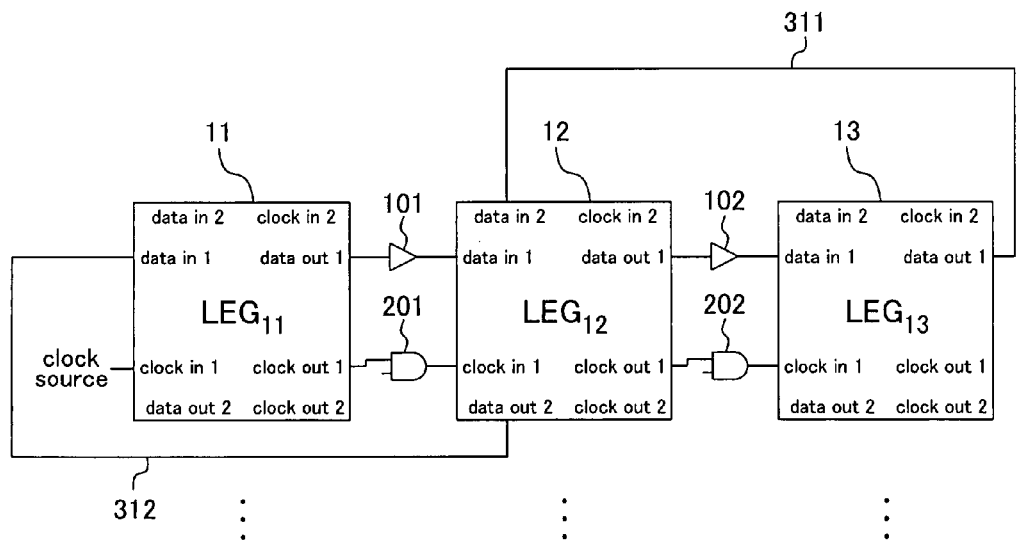
FIG. 6 is a view showing a data line feedback configuration in the case of failing to satisfy the setup constraint in the reconfigurable semiconductor integrated circuit of Embodiment 1.

FIG. 6 shows another alteration to the processing assignment method for the reconfigurable semiconductor integrated circuit of FIG. 1.

In the above alteration, described was the case that when there existed data transfer from the logic element group 13 to the logic element group 11, the setup constraint was satisfied in the logic element group 11 as the receiver side of data outputted from the logic element group 13 large in the delay of the clock signal. In this alteration, the case that the setup constraint is not satisfied will be described.

In the case that the setup constraint is not satisfied in the logic element group 11 as the receiver side of data outputted from the logic element group 13, lines are assigned so that connection is made to the data input data in 1 of a logic element group located within the range where the setup constraint is satisfied (for example, the logic element group 12) and then made from the data output data out 2 of the logic element group 12 to the data input data in 1 of the logic element group 11 via a data line 312, to thereby transfer the data by way of the logic element group 12.

In the above description, data was relayed via the logic element group 12. Alternatively, assignment of processing and lines may be made so that data is transferred via the relay circuit (data relay means) 401 shown in FIG. 2.

Thus, in the two alterations described above, lines can be assigned to the same path regardless of whether the setup constraint of data in the logic element group as the data receiver side is satisfied or not satisfied. This improves the degree of freedom of line routing for data transmission.

Note that although the above alterations were described using the logic element groups 11 to 13, they also apply to any data transfer in the direction opposite to the direction in which delay in clock signal is accumulated among any given logic element groups not limited to the above combination.

In the above alterations, the line delay was halved using one logic element group or relay circuit. Alternatively, the line delay may be divided into three, four and the like depending on the situation. In such division of the line delay, the line delay is preferably divided into equal parts because a resource required for data feedback can be minimized.

Embodiment 2

Figure 7:
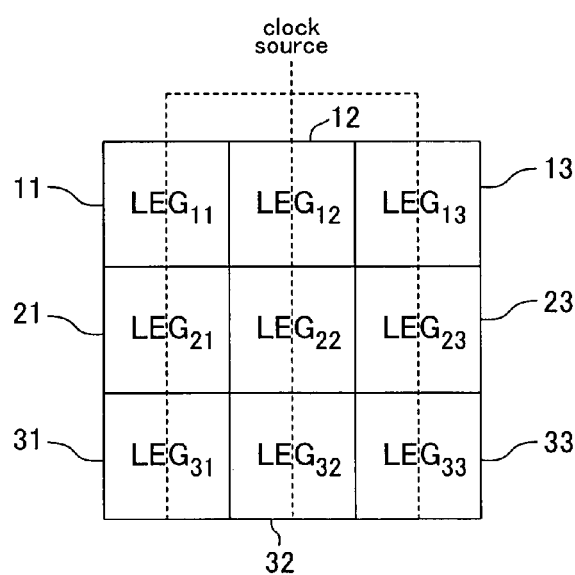
FIG. 7 is a view showing a schematic configuration of a reconfigurable semiconductor integrated circuit of Embodiment 2 of the present invention.

FIG. 7 shows a schematic configuration of a reconfigurable semiconductor integrated circuit of Embodiment 2 of the present invention.

In FIG. 7, the reconfigurable semiconductor integrated circuit of this embodiment is identical to that of Embodiment 1 shown in FIG. 1 except for clock line routing.

In this embodiment, the clock line is routed as follows. A skew-adjusted clock signal is inputted into the three logic element groups 11 to 13 on the first row. Clock signals outputted from the logic element groups 11 to 13 are skew-adjusted and inputted into the logic element groups 21 to 23 on the second row, and clock signals outputted from the logic element groups 21 to 23 are skew-adjusted and inputted into the logic element groups 31 to 33 on the third row.

In Embodiment 1, clock skew is not made uniform among the logic element groups 11 to 33. In this embodiment, clock skew is made uniform for the logic element groups on the same row.

Accordingly, in this embodiment, in which clock skew has been adjusted among the three logic element groups on the same row, tasks to be done at the same time may be assigned to the logic element groups on the same row in assignment of such a type of processing that the processing amount is roughly the same at any time hardly varying with time. With this assignment, the numbers of logic element groups used at respective times will be roughly the same, and the number of non-operating logic element groups can be reduced. Thus, the use efficiency of the logic element groups can be improved.

In this embodiment, skew in the logic element groups on the same row was made uniform. Alternatively, it goes without mentioning that skew in the logic element groups on the same column may be made uniform.

(Processing Assignment Method)

Figure 8:
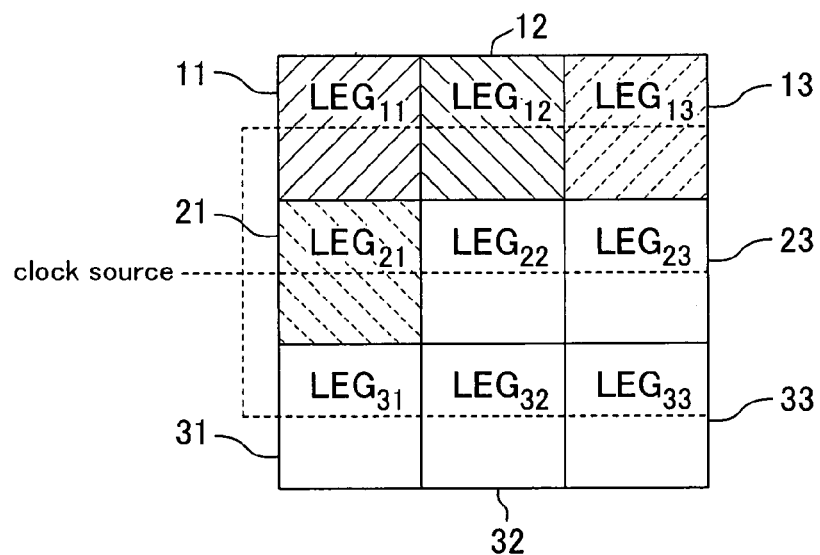
FIG. 8 is a view showing a configuration of the reconfigurable semiconductor integrated circuit of Embodiment 2 after processing has been assigned considering a feedback path.

FIG. 8 shows a processing assignment method for the reconfigurable semiconductor integrated circuit of Embodiment 2.

In processing assignment for the reconfigurable semiconductor integrated circuit of this embodiment, processing may be assigned to the logic element groups considering the way of routing lines in addition to the processing assignment method described in Embodiment 1. With this consideration, the efficiency improves.

That is, defining a data transfer path from a logic element group large in the clock delay time from the clock source to a logic element group small in clock delay time as a feedback path, search is made to find whether or not such a feedback path exists. If a feedback path exists, in assignment of processing to logic element groups having such a feedback path, processing of outputting data to the feedback path is assigned to a logic element group located at a position where the delay time of the feedback path is as small as possible. This will be described in more specifically as follows.

In the processing assignment method of Embodiment 1 described above, when one piece of processing is divided into three tasks and these tasks, 1, 2 and 3, are lined in time sequence, for example, the tasks 1, 2 and 3 are respectively assigned to the logic element groups 11, 12 and 13 in FIG. 1. Assume in this case that data transfer from the task 3 to the task 1 has been found by search and that a relay circuit or a logic element group for relaying is necessary for data transfer from the logic element group 13 to the logic element group 11. In this situation, as shown in FIG. 8, the task 3 is assigned to the logic element group 21 located closer to the logic element group 11 so that the delay time of the feedback path falls within a predetermined delay time allowable range that satisfies the setup constraint of the logic element group 11. With this assignment, no relay circuit or a logic element group for relaying is necessary.

Thus, in the processing assignment method of this embodiment, in which there is no data feedback path failing to satisfy the setup constraint, a resource required for feedback can be omitted and thus reduction in area and power consumption can be attained.

Embodiment 3

Figure 9:
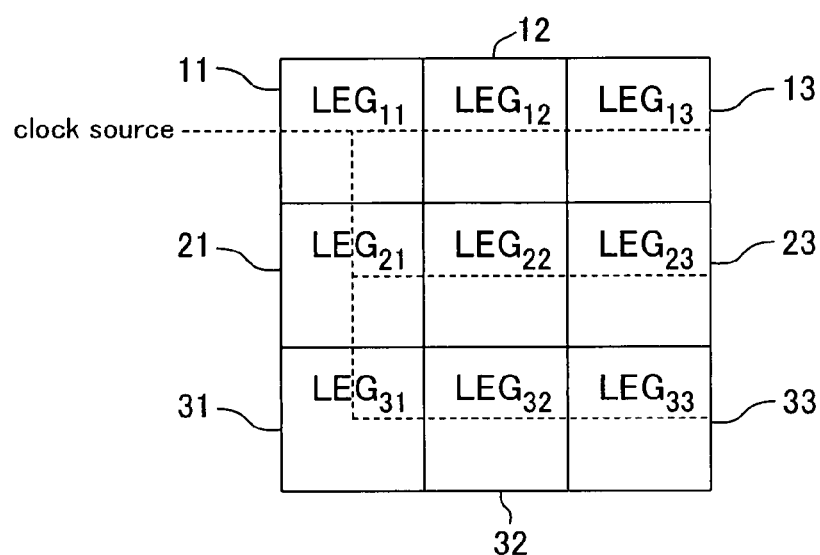
FIG. 9 is a view showing a schematic configuration of a reconfigurable semiconductor integrated circuit of Embodiment 3 of the present invention.

FIG. 9 shows a configuration of a reconfigurable semiconductor integrated circuit of Embodiment 3 of the present invention.

The reconfigurable semiconductor integrated circuit of this embodiment is identical to that of Embodiment 1 except for clock line routing.

In this embodiment, in the logic element groups 11 to 33 arranged in a two-dimensional matrix of three rows and three columns (x=3, y=3), the clock line is first routed to the first-row, first-column logic element group 11. Thereafter, the clock line is routed to the first-row, second-column logic element group 12 and the second-row, first-column logic element group 21, then to the first-row, third-column logic element group 13, the second-row, second-column logic element group 22 and the third-row, first-column logic element group 31, then to the second-row, third-column logic element group 23 and the third-row, second-column logic element group 32, and finally to the third-row, third-column logic element group 33.

The clock signals inputted into the first-row, second-column logic element group 12 and the second-row, first-column logic element group 21 are mutually skew-adjusted. The clock signals inputted into the first-row, third-column logic element group 13, the second-row, second-column logic element group 22 and the third-row, first-column logic element group 31 are mutually skew-adjusted. The clock signals inputted into the second-row, third-column logic element group 23 and the third-row, second-column logic element group 32 are mutually skew-adjusted. That is, when the positions of a given logic element group in the row and column directions are respectively expressed by a and b, a plurality of logic element groups equal in the value of $|x-a|+|y-b|$ are set to have an equal clock delay.

Accordingly, in the configuration described above, there are one logic element group 11 smallest in clock signal delay time, two logic element groups 12 and 21 next smallest in clock signal delay time, and three logic element groups 13, 22 and 31 larger in clock signal delay time. By assigning such a type of processing that the processing amount increases with time to the logic element groups having the above clock signal delay relationship, therefore, the use efficiency of the logic element groups will enhance.

Moreover, in assignment of continuously operating processing (for example, a control circuit and the like controlling the entire processing) and non-continuously operating processing (for example, an arithmetic circuit and the like operating in response to an instruction from the control circuit), the continuously operating processing may be assigned to a logic element group 11 small in the clock signal delay time from the clock supply point, and the non-continuously operating processing may be assigned to a logic element group (12, 21) or (13, 22, 31) large in the clock delay time from the clock supply point. With this assignment, supply of the clock signal to such a logic element group can be stopped during the time when the non-continuously operating processing does not operate, and thus reduction in power consumption can be attained.

The reconfigurable semiconductor integrated circuit and the processing assignment method for such a semiconductor integrated circuit according to the present invention were described based on the embodiments. The present invention is not limited to these embodiments. For example, alterations as follows can be assumed.

(1) In the above description, logic element groups were arranged in a two-dimensional matrix of 3×3. The present invention is not limited to this but is also applicable to those arranged in a two-dimensional matrix of M×N (M and N are any given natural numbers), those arranged in a three-dimensional matrix of M×N×K (M, N and K are any given natural numbers), and those not arranged in a matrix.

(2) In the above description, the AND circuits 201 to 208 were inserted on the clock lines between the logic element groups 11 to 33, to enable selection of whether or not to supply the clock signal. It is not necessarily required to insert the AND circuits between all the logic element groups. Also, circuits other than the AND circuits may be used as long as they can provide selection of whether or not to supply the clock signal.

(3) In the above description, each two of data inputs, data outputs, clock inputs and clock outputs were provided for each of the logic element groups 11 to 33. The numbers of the inputs/outputs are not necessarily the same and are not limited to two.

(4) In the above description, each of the delay elements 101 to 112 inserted on the data lines for securing hold was made of a buffer. The element is not limited to the buffer but may be any circuit that can provide a delay.

INDUSTRIAL APPLICABILITY

As described above, according to the present invention, even if there arises a necessity to redesign a reconfigurable semiconductor integrated circuit, no clock redesign involving existing circuits is necessary, and thus the design time of a new reconfigurable semiconductor integrated circuit can be effectively shortened. The present invention is therefore useful as programmable logic devices represented by FPGAs and a method for assigning processing to such devices.

The invention claimed is:

1. A reconfigurable semiconductor integrated circuit provided with a plurality of logic elements as components, comprising:
   a plurality of logic element groups each having at least one of the logic elements,
   wherein each of the plurality of logic element groups has at least one of each of data input, data output, clock input and clock output,
   supply of a clock signal to a (k+1)th (k is any given natural number) logic element group among the plurality of logic element groups is attained by connecting a clock output of a k-th logic element group to a clock input of the (k+1)th logic element group, and
   a delay element is inserted on a data line from the k-th logic element group to the (k+1)th logic element group so that a hold constraint of the (k+1)th logic element group is satisfied.

2. The reconfigurable semiconductor integrated circuit of claim 1, wherein a data output of an l-th (l is a natural number satisfying l<k) logic element group is connected to a data input of the k-th logic element group.

3. The reconfigurable semiconductor integrated circuit of claim 1, wherein a data output of an m-th (m is a natural number satisfying m>k) logic element group is connected to a data input of the k-th logic element group.

4. The reconfigurable semiconductor integrated circuit of claim 3, wherein relay means for data transfer is provided on a data line from the m-th logic element group to the k-th logic element group.

5. The reconfigurable semiconductor integrated circuit of claim 1, wherein the delay element inserted to satisfy the hold constraint is provided in the k-th logic element group as the data output side.

6. The reconfigurable semiconductor integrated circuit of claim 1, wherein the delay element inserted to satisfy the hold constraint is provided on the data line between the k-th logic element group as the data output side and the (k+1)th logic element group as the data input side.

7. The reconfigurable semiconductor integrated circuit of claim 1, wherein the delay element inserted to satisfy the hold constraint is provided in the (k+1)th logic element group as the data input side.

8. The reconfigurable semiconductor integrated circuit of claim 1, wherein the delay element inserted to satisfy the hold constraint is provided at at least one position among in the k-th logic element group as the data output side, on the data line between the k-th logic element group as the data output side and the (k+1)th logic element group as the data input side, and in the (k+1)th logic element group as the data input side.

9. The reconfigurable semiconductor integrated circuit of claim 1, wherein a logic gate permitting selection of whether or not to supply the clock signal to the (k+1)th logic element group is provided on a clock line between the clock output of the k-th logic element group and the clock input of the (k+1)th logic element group.

10. The reconfigurable semiconductor integrated circuit of claim 1, wherein the plurality of logic element groups are arranged in a two-dimensional matrix, and
   a plurality of logic element groups arranged in a same row in the two-dimensional matrix are set to have an equal delay time from a clock source.

11. The reconfigurable semiconductor integrated circuit of claim 1, wherein the plurality of logic element groups are arranged in a two-dimensional matrix, and
   a plurality of logic element groups arranged in a same column in the two-dimensional matrix are set to have an equal delay time from a clock source.

12. The reconfigurable semiconductor integrated circuit of claim 1, wherein the number of synchronized logic element groups placed at positions large in the delay time from a clock source is set to be larger than the number of synchronized logic element groups placed at positions small in the delay time from the clock source.

13. The reconfigurable semiconductor integrated circuit of claim 1, wherein the plurality of logic element groups are arranged in a two-dimensional matrix of M×N (M and N are natural numbers), and
   when the clock signal is inputted into a logic element group located at a position xy (x is any given natural number between 1 to M and y is any given natural number between 1 to N) in the two-dimensional matrix, a plurality of logic element groups equal in the value of $|x-a|+|y-b|$, among logical element groups located at a position ab (a is a natural number satisfying $a \neq x$ and $a \leq M$, and b is a natural number satisfying $b \neq y$ and $y < b \leq N$), are set to have an equal clock delay.

14. The reconfigurable semiconductor integrated circuit of claim 10, wherein the plurality of logic element groups are arranged in a three-dimensional matrix.

15. The reconfigurable semiconductor integrated circuit of claim 1, wherein a delay amount of data lines between the logic element groups is determined according to a delay amount of clock lines between the logic element groups.

16. The reconfigurable semiconductor integrated circuit of claim 1, wherein clock signals different in delay are supplied to the logic element groups.

17. A processing assignment method for a reconfigurable semiconductor integrated circuit for assigning processing for a reconfigurable semiconductor integrated circuit including a plurality of logic element groups each having at least one logic element,
   supply of a clock signal to a (k+1)th (k is any given natural number) logic element group among the plurality of logic element groups being attained by connecting a clock output of a k-th logic element group to a clock input of the (k+1)th logic element group, and
   a delay element being inserted on a data line from the k-th logic element group to the (k+1)th logic element group so that a hold constraint of the (k+1)th logic element group is satisfied,
   the processing assignment method comprising:
   sorting two or more tasks constituting one piece of processing in time sequence; and
   assigning a task earlier in the order of the tasks sorted in time sequence to a logic element group closer to a clock source.

18. The processing assignment method for a reconfigurable semiconductor integrated circuit of claim 17, wherein whether the processing is continuously operating processing or non-continuously operating processing is determined,
   the continuously operating processing is assigned to a logic element group small in the delay time from the clock source, and
   the non-continuously operating processing is assigned to a logic element group large in the delay time from the clock source.

19. The processing assignment method for a reconfigurable semiconductor integrated circuit of claim 17, wherein in data transfer from a first logic element group large in the delay time from the clock source to a second logic element group small in the delay time from the clock source, whether or not the data transfer falls within a range in which a setup time of the second logic element group is secured is determined, and if it falls within the range in which the setup time of the second logic element group is secured, processing is assigned to the first and second element groups so that data is directly transferred from the first logic element group to the second logic element group.

20. The processing assignment method for a reconfigurable semiconductor integrated circuit of claim 17, wherein in data transfer from a first logic element group large in the delay time from a clock source to a second logic element group small in the delay time from the clock source, whether or not the data transfer falls within a range in which a setup time of the second logic element group is secured is determined, and if it does not fall within the range in which the setup time of the second logic element group is secured, processing is assigned to the first and second element groups so that data is sequentially transferred from the first logic element group to the second logic element group via at least one logic element group for data relaying with which the setup time is secured.

21. The processing assignment method for a reconfigurable semiconductor integrated circuit of claim 17, wherein in data transfer from a first logic element group large in the delay time from a clock source to a second logic element group small in the delay time from the clock source, whether or not the data transfer falls within a range in which a setup time of the second logic element group is secured is determined, and if it does not fall within the range in which the setup time of the second logic element group is secured, processing is assigned to the first and second element groups so that data is sequentially transferred from the first logic element group to the second logic element group via at least one data relay means with which the setup time is secured.

22. The processing assignment method for a reconfigurable semiconductor integrated circuit of claim 20, wherein the at least one logic element group for data relaying is selected so that the delay time of a data line from the first logic element group to the second logic element group is divided into equal parts.

23. The processing assignment method for a reconfigurable semiconductor integrated circuit of claim 21, wherein the at least one data relay means is provided so that the delay time of a data line from the first logic element group to the second logic element group is divided into equal parts.

24. A processing assignment method for a reconfigurable semiconductor integrated circuit for assigning processing for a reconfigurable semiconductor integrated circuit including a plurality of logic element groups each having at least one logic element, supply of a clock signal to a (k+1)th (k is any given natural number) logic element group among the plurality of logic element groups being attained by connecting a clock output of a k-th logic element group to a clock input of the (k+1)th logic element group, and a delay element being inserted on a data line from the k-th logic element group to the (k+1)th logic element group so that a hold constraint of the (k+1)th logic element group is satisfied, the processing assignment method comprising:

searching for a feedback path as a data transfer path from a logic element group large in the clock delay time from a clock source to a logic element group small in clock delay time; and assigning processing to the logic element group large in clock delay time so that the delay time of the feedback path found by the search falls within a predetermined range.

25. The processing assignment method for a reconfigurable semiconductor integrated circuit of claim 24, wherein the predetermined range is a delay time range satisfying a setup constraint of a logic element group that receives data.

26. The reconfigurable semiconductor integrated circuit of claim 11, wherein the plurality of logic element groups are arranged in a three-dimensional matrix.

27. The reconfigurable semiconductor integrated circuit of claim 13, wherein the plurality of logic element groups are arranged in a three-dimensional matrix.

* * * * *